United States Patent
Park et al.

(10) Patent No.: US 9,947,845 B2
(45) Date of Patent: Apr. 17, 2018

(54) METHOD OF FABRICATING LIGHT EMITTING DIODE AND LIGHT EMITTING DIODE MANUFACTURED THEREBY

(71) Applicant: GWANGJU INSTITUTE OF SCIENCE AND TECHNOLOGY, Gwangju (KR)

(72) Inventors: Seong-Ju Park, Gwangju (KR); Young-Chul Leem, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 6 days.

(21) Appl. No.: 15/000,780

(22) Filed: Jan. 19, 2016

(65) Prior Publication Data

US 2016/0211413 A1    Jul. 21, 2016

(30) Foreign Application Priority Data

Jan. 19, 2015  (KR) .......................... 10-2015-0008536

(51) Int. Cl.
| | |
|---|---|
| H01L 21/00 | (2006.01) |
| H01L 33/58 | (2010.01) |
| H01L 33/40 | (2010.01) |
| H01L 33/00 | (2010.01) |
| H01L 33/38 | (2010.01) |

(52) U.S. Cl.
CPC .......... *H01L 33/58* (2013.01); *H01L 33/0079* (2013.01); *H01L 33/382* (2013.01); *H01L 33/405* (2013.01); *H01L 2933/0058* (2013.01); *H01L 2933/0091* (2013.01)

(58) Field of Classification Search
CPC ...................................................... H01L 33/58
USPC ........................................................... 438/29
See application file for complete search history.

(56) References Cited

U.S. PATENT DOCUMENTS

2013/0214245 A1* 8/2013 Chang .................... H01L 33/20
257/13

\* cited by examiner

*Primary Examiner* — Hsin-Yi Hsieh
(74) *Attorney, Agent, or Firm* — Hauptman Ham, LLP

(57) ABSTRACT

Disclosed are a method of fabricating a light emitting diode and a light emitting diode fabricated by the same. In the method of fabricating a light emitting diode, a convex-concave pattern is formed on a light emitting structure and a nanosphere layer is transferred to the convex-concave pattern, followed by dry etching to form a stepped surface structure having a plurality of nanobumps arranged on a surface thereof, and chemical coating to reduce surface energy of the stepped surface structure. The method can easily form a stepped surface structure having a plurality of nanobumps on a surface of a convex-concave pattern periodically arranged through nanosphere lithography and dry etching, thereby simplifying the fabrication process while improving production yield.

14 Claims, 15 Drawing Sheets

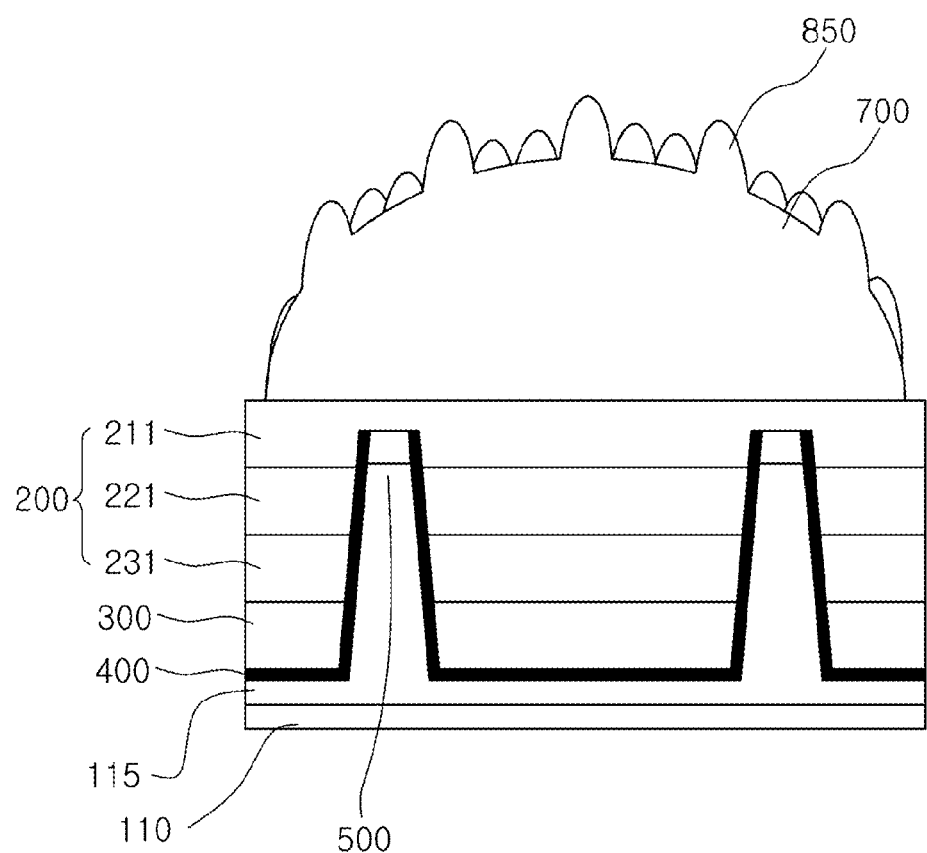

METHOD OF FABRICATING LIGHT EMITTING DIODE AND LIGHT EMITTING DIODE MANUFACTURED THEREBY

CROSS-REFERENCE TO RELATED APPLICATIONS

This application claims the priority of Korean Patent Application No. KR 10-2015-0008536 filed on Jan. 19, 2015, in the Korean Intellectual Property Office, the disclosure of which is incorporated herein by reference.

BACKGROUND

1. Technical Field

The present invention relates to a light emitting diode, and more particularly, to a method of fabricating a light emitting diode having a stepped surface structure and a light emitting diode fabricated by the same.

2. Description of the Related Art

With various advantages such as low power consumption, vibration resistance and rapid response, a light emitting diode secures better energy efficiency than existing light sources in the related art and has been expanded in application range thereof by replacing existing light sources. In addition, together with expansion of application of the light emitting diode not only to lighting but also to displays, electronic products and automotive components, a variety of research has been carried out to improve efficiency of the light emitting diode. Specifically, in order to improve efficiency of the light emitting diode, a surface structure capable of improving light extraction efficiency is formed on a surface of the light emitting diode through photolithography to change behavior of light inside the light emitting diode.

However, epitaxial layers (active layer and semiconductor layers) formed on a large substrate can be warped due to difference in lattice parameter and coefficient of thermal expansion during growth thereof, thereby making it difficult to form a uniform surface structure only through photolithography in fabrication of a large light emitting diode. Moreover, a micrometer-scale surface structure formed through photolithography has a limit to improvement in light extraction efficiency due to internal reflection by a difference index of refraction of air upon emission of light from the light emitting diode.

In order to solve this problem, although it has been suggested in the related art that a nanoscale structure be formed on the surface structure using an alkali solution such as KOH or NaOH so as to improve uniformity of light characteristics of the light emitting diode, this technique requires chemical reaction, thereby making it difficult to control the fabrication process and the shape of the surface structure as compared with physical etching. Moreover, upon formation of a nanostructure using this technique, a hexagonal close-packed pyramid structure surrounded by $\{10\text{-}1\text{-}1\}$ planes is formed through selective etching, in which a side surface angle of the nanostructure is fixed to 31.6°. However, since it is known that a light emitting diode including the nanostructure having a side surface angle of 23.4° provides maximum light output, there is a need for improvement in development of a surface structure and a process technique capable of improving light output and light uniformity of the light emitting diode.

Furthermore, as a next generation light source, a light emitting diode is required to have novel functions. In practical use, a light emitting diode and products including the same can be exposed to contaminants such as dust, which blocks extraction of light from the light emitting diode, thereby causing reduction in power efficiency thereof.

BRIEF SUMMARY

It is an aspect of the present invention to provide a method of fabricating a light emitting diode, which can be realized in a large area and has a surface structure exhibiting good properties in terms of light output and light uniformity, and a light emitting diode fabricated by the same.

The light emitting diode fabricated by the method according to the present invention has a surface structure imparting superhydrophobicity and superoleophobicity to suppress deterioration in power efficiency of the light emitting diode due to contaminants, thereby improving lifespan of the light emitting diode.

In accordance with one aspect of the present invention, a method of fabricating a light emitting diode includes: forming a light emitting structure by sequentially stacking a first conductive type semiconductor layer, an active layer and a second conductive type semiconductor layer on a substrate; forming a convex-concave pattern on the light emitting structure; transferring a nanosphere layer to an upper surface of the convex-concave pattern; and forming a stepped surface structure having a plurality of nanobumps arranged on the upper surface of the convex-concave pattern by dry etching the nanosphere layer.

The method may further include coating the stepped surface structure to reduce surface energy thereof.

The convex-concave pattern may include a plurality of convex portions having one shape selected from among a semispherical shape, a conical shape and a poly-pyramidal shape.

The step of forming a convex-concave pattern on the light emitting structure may be performed through photolithography.

The step of forming a convex-concave pattern on the light emitting structure may include forming a material layer for formation of the convex-concave pattern on a support substrate, forming the convex-concave pattern on the material layer for formation of the convex-concave pattern through photolithography, and transferring the material layer for formation of the convex-concave pattern having the convex-concave pattern formed thereon to an upper surface of the light emitting structure.

The step of transferring a nanosphere layer to an upper surface of the convex-concave pattern may include forming the nanosphere layer on a support substrate through nanosphere lithography, attaching the nanosphere layer to the convex-concave pattern using a thermal release tape, performing thermal compression, and removing the thermal release tape from the nanosphere layer.

The step of forming the nanosphere layer on a support substrate through nanosphere lithography may include depositing a solution, in which a plurality of nanosphere particles capable of self-assembling is dispersed, onto the support substrate, and crystallizing the nanosphere particles into a colloid to form a nanosphere layer having a two-dimensional colloidal crystal structure on the support substrate.

The nanosphere particles may include at least one material selected from among silicon (Si), titanium (Ti), gold (Au), silver (Ag), platinum (Pt), iron (Fe), copper (Cu), aluminum (Al), nickel (Ni), and oxides, nitrides and sulfides thereof.

The step of crystallizing the nanosphere particles into a colloid may be performed by one method selected from among evaporation, electrostatic deposition, dip coating, Langmuir-Blodgett coating, electrophoretic deposition, and spin coating.

The step of attaching the nanosphere layer to the convex-concave pattern using a thermal release tape, followed by thermal compression may be performed at a temperature of 100° C. to 200° C. under a load of 0.1 MPa to 1 MPa.

Dry etching of the nanosphere layer may be performed by inductively coupled plasma/reactive ion etching, or reactive ion etching using at least one etching gas selected from among $Cl_2$, Ar, $CH_4$, $H_2$, HBr and $BCl_3$.

The step of coating the stepped surface structure to reduce surface energy thereof may include depositing at least one material selected from among a fluorinated acrylic copolymer, 1H,1H,2H,2H-heptadecafluorodecyl modified polyhedral oligomeric silsesquioxane (fluoroPOSS), PTFE amorphous fluoropolymer, fluorinated monoalkylphosphates, n-perfluoroeicosane, tridecafluoro-1,1,2,2-tetrahydrooctyl-trichlorosilane, fluorinated 3,4-ethylenedioxypyrrole (EDOP) monomer, and semifluorinated silane ((trideca-fluoro-1,1,2,2-tetrahydrooctyl)-1-trichlorosilane) on a periodic stepped surface structure.

The step of coating the stepped surface structure to reduce surface energy thereof may be performed by vacuum evaporation, spin coating, dip coating, spray coating, or molecular vapor deposition.

In one embodiment, the method of fabricating a light emitting diode may further include, before forming the convex-concave pattern on the light emitting structure, forming a reflective electrode layer on the light emitting structure, partially etching the light emitting structure and the reflective electrode layer to expose a partial region of the first conductive type semiconductor layer, forming a passivation layer on an upper surface of the reflective electrode layer and side surfaces of the light emitting structure and the reflective electrode layer exposed by etching, forming a first electrode on the exposed partial region of the first conductive type semiconductor layer, bonding a carrier substrate to an upper surface of the passivation layer via a bonding member, separating the light emitting structure from the substrate, and forming a second electrode on a partial region of the reflective electrode layer.

In another embodiment, the method of fabricating a light emitting diode may further include forming first and second electrodes on partial regions of the first conductive type semiconductor layer and the second conductive type semiconductor layer, respectively.

In accordance with another aspect of the present invention, a light emitting diode fabricated by the method of fabricating a light emitting diode set forth above is provided.

The method according to embodiments of the present invention can form a stepped surface structure having a plurality of nanobumps on a surface of a convex-concave pattern periodically arranged through nanosphere lithography and dry etching, thereby simplifying the fabrication process while improving production yield.

The light emitting diode according to embodiments of the present invention can improve light output (light extraction) and light uniformity through the stepped surface structure.

In addition, physical and chemical hybrid effects of the stepped surface structure and the process of coating to reduce surface energy provide a self-cleaning function with respect to contaminants based on superhydrophobic and superoleophobic properties. Such a function can prevent deterioration in luminous efficacy of the light emitting diode due to contaminants while improving lifespan of the light emitting diode.

It should be understood that the present invention is not limited to the above effects, and other effects can become apparent to those skilled in the art from the following description of the present invention.

BRIEF DESCRIPTION OF THE DRAWINGS

The above and other aspects, features and advantages of the invention will become apparent from the following description of exemplary embodiments given in conjunction with the accompanying drawings, in which:

FIG. 2a to FIG. 2j are schematic sectional views illustrating the method of fabricating a light emitting diode according to the embodiment of the present invention;

DETAILED DESCRIPTION

Figure 1:
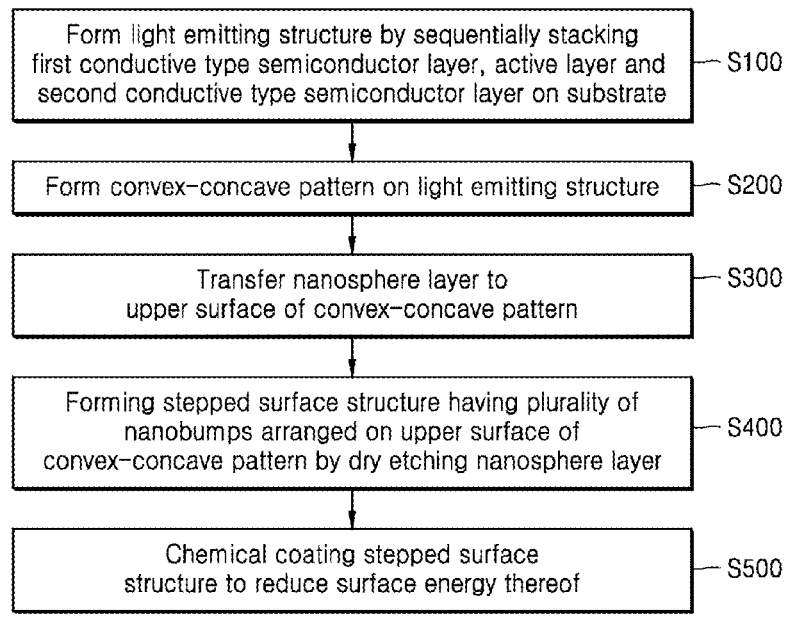
FIG. 1 is a flowchart illustrating a method of fabricating a light emitting diode according to one embodiment of the present invention.

Hereinafter, embodiments of the present invention will be described in detail with reference to the accompanying drawings.

The present invention can be realized in different ways through modifications and changes, and exemplary embodiments of the present invention will be described in detail with reference to the accompanying drawings. However, it should be understood that the present invention is not limited to the following embodiments, and that various modifications, substitutions, and equivalent embodiments can be made by those skilled in the art without departing from the spirit and scope of the present invention.

It should be noted that the drawings are not to precise scale and may be exaggerated or reduced in thickness of layers and regions for descriptive convenience and clarity only. The same components will be denoted by the same reference numerals throughout the specification.

The present invention provides a method of fabricating a light emitting diode including a stepped surface structure. Specifically, the method of fabricating a light emitting diode according to the present invention may include: 1) forming a light emitting structure by sequentially stacking a first conductive type semiconductor layer, an active layer and a second conductive type semiconductor layer on a substrate (S100); 2) forming a convex-concave pattern on the light emitting structure (S200); 3) transferring a nanosphere layer to an upper surface of the convex-concave pattern (S300); 4) forming a stepped surface structure having a plurality of nanobumps arranged on the upper surface of the convex-concave pattern by dry etching the nanosphere layer (S400); and 5) coating the stepped surface structure to reduce surface energy thereof (S500).

FIG. 1 is a flowchart illustrating a method of fabricating a light emitting diode according to one embodiment of the present invention.

Referring to FIG. 1, in step 1) of the method of fabricating a light emitting diode according to one embodiment of the present invention, a light emitting structure may be formed by sequentially stacking a first conductive type semiconductor layer, an active layer and a second conductive type semiconductor layer on a substrate (S100).

The substrate may be selected from any typical substrates for light emitting diodes known in the art. Specifically, the substrate may include at least one selected from among sapphire ($Al_2O_3$), silicon (Si), silicon carbide (SiC), gallium nitride (GaN), gallium arsenide (GaAs), gallium phosphide (GaP) and zinc oxide (ZnO) substrates, without being limited thereto.

In some embodiments, a buffer layer may be formed between the substrate and the light emitting structure. The buffer layer may act to relieve stress between the substrate and the light emitting structure. The buffer layer may be composed of at least one material selected from among silicon (Si), silicon carbide (SiC), zinc oxide (ZnO), gallium nitride (GaN), gallium arsenide (GaAs), and aluminum nitride (AlN), without being limited thereto. Formation of the buffer layer on the substrate may be performed by metal organic chemical vapor deposition (MOCVD), molecular beam epitaxy (MBE), hydride vapor phase epitaxy (HYPE), or sputtering.

The first conductive type semiconductor layer and the second conductive type semiconductor layer constituting the light emitting structure formed on the substrate may be composed of at least one material selected from the group consisting of Group III-V compound semiconductor materials, Group II-IV compound semiconductor materials and Si. Alternatively, the first conductive type semiconductor layer and the second conductive type semiconductor layer may be composed of at least one semiconductor material selected from among GaN-based semiconductor, ZnO-based semiconductor, GAP-based semiconductor, GaAs-based semiconductor, and GaAs-based semiconductor materials.

The first conductive type semiconductor layer and the second conductive type semiconductor layer may be formed by doping suitable dopants selected by taking into account a conductive type thereof on the aforementioned semiconductor material. Specifically, when the first conductive type semiconductor layer is doped into an n-type semiconductor layer, the second conductive type semiconductor layer may be doped into a p-type semiconductor layer, and when the first conductive type semiconductor layer is doped into a p-type semiconductor layer, the second conductive type semiconductor layer may be doped into an n-type semiconductor layer. For example, in the structure wherein the first conductive type semiconductor layer and the second conductive type semiconductor layer are GaN-based semiconductor layers, the first conductive type semiconductor layer may be an n-type semiconductor layer doped with silicon (Si) and the second conductive type semiconductor layer may be a p-type semiconductor layer doped with magnesium (Mg).

The active layer constituting the light emitting structure formed on the substrate is formed between the first conductive type semiconductor layer and the second conductive type semiconductor layer and emits light through recombination of electrons and holes, in which the light has different wavelengths depending upon the kind of material constituting the active layer and the thickness of the active layer. Specifically, the active layer may be formed of a material having a narrower energy band-gap than the first conductive type semiconductor layer and the second conductive type semiconductor layer. For example, when the first conductive type semiconductor layer and the second conductive type semiconductor layer are GaN-based compound semiconductors, the active layer may be composed of a semiconductor material represented by $In_xAl_yGa_{(1-x-y)}N$ ($0 \leq x < 1$, $0 \leq y < 1$, and $0 \leq x+y < 1$). Specifically, the active layer may have a single quantum well layer or a multi-quantum well layer structure, in which a well layer is formed of InGaN and a barrier layer is formed of GaN.

The step of forming the light emitting structure by sequentially stacking the first conductive type semiconductor layer, the active layer and the second conductive type semiconductor layer on the substrate may be performed by metal organic chemical vapor deposition (MOCVD), molecular beam epitaxy (MBE), hydride vapor phase epitaxy (HYPE), or sputtering. Through these processes, the first conductive type semiconductor layer, the active layer and the second conductive type semiconductor layer are sequentially stacked on the substrate, thereby forming the light emitting structure composed of the first conductive type semiconductor layer, the active layer, and the second conductive type semiconductor layer.

Referring to FIG. 1, in step 2) of the method of fabricating a light emitting diode according to the embodiment of the present invention, a convex-concave pattern may be formed on the light emitting structure (S200).

The convex-concave pattern may act as a frame of the stepped surface structure according to the present invention, which relieves total internal reflection of the light emitting structure to improve light extraction efficiency of the light emitting diode including the light emitting structure.

The convex-concave pattern may include a plurality of convex portions having at least one shape selected from among a semispherical shape, a conical shape, and a polypyramidal shape. Specifically, the convex-concave pattern may be uniformly repeatedly arranged in a certain cycle formed on the second conductive type semiconductor layer disposed at an upper portion of the light emitting structure (in some embodiments, on the first conductive type semiconductor layer), or on a material layer for formation of the convex-concave pattern. In this structure, a bottom portion may be present between the convex portions repeatedly arranged in a certain cycle. That is, the convex-concave pattern formed on the second conductive type semiconductor layer disposed at an upper portion of the light emitting structure (in some embodiments, on the first conductive type semiconductor layer), or on the material layer for formation of the convex-concave pattern may include a structure wherein the convex portions and the bottom portions are alternately arranged. The convex portion may have a diameter of several micrometers to hundreds of micrometers.

In one embodiment, the step of forming the convex-concave pattern on the light emitting structure may be performed through photolithography. Specifically, the convex-concave pattern may be formed by patterning an upper layer of the light emitting structure (in some embodiments, the second conductive type semiconductor layer or the first conductive type semiconductor layer) using a photolithography technology known in the art. Specifically, in one embodiment of the invention, with a photoresist deposited on the second conductive type semiconductor layer, a mask having a desired pattern shape is placed on the second conductive type semiconductor layer, followed by exposure to allow the desired pattern to be transferred to the second conductive type semiconductor layer. Thereafter, etching is performed through the pattern transferred onto the second conductive type semiconductor layer, which is used as an etching mask, followed by removal of the photoresist, whereby the convex-concave pattern including the plurality of convex portions can be formed on the second conductive type semiconductor layer. Alternatively, a photoresist having a pattern to be used in photolithography may be used as an etching mask to form a plurality of micrometer scale convex-concave patterns on the light emitting structure. In one embodiment of the invention, etching may be performed by dry etching, which may be performed by inductively coupled plasma (ICP)/reactive ion etching (RIE), or reactive ion etching using at least one etching gas selected from among $Cl_2$, Ar, $CH_4$, $H_2$, HBr and $BCl_3$, without being limited thereto.

In another embodiment, the step of forming the convex-concave pattern on the light emitting structure may include forming a material layer for formation of the convex-concave pattern on a support substrate (S210), forming the convex-concave pattern on the material layer for formation of the convex-concave pattern through photolithography (S220), and transferring the material layer for formation of the convex-concave pattern having the convex-concave pattern formed thereon to an upper surface of the light emitting structure (S230).

The support substrate is a growth substrate for deposition of the material layer for formation of the convex-concave pattern and may be selected from any substrates for light emitting diodes known in the art. The material layer for formation of the convex-concave pattern is a matrix layer which will constitute the convex-concave pattern, and may be formed of a similar semiconductor material or the same semiconductor material as the second conductive type semiconductor layer formed at the upper portion of the light emitting structure (in some embodiments, the first conductive type semiconductor layer), to which the convex-concave pattern will be transferred. Specifically, the material layer for formation of the convex-concave pattern may be composed of at least one semiconductor material selected from among GaN-based semiconductors, ZnO-based semiconductors, GAP-based semiconductors, GaAs-based semiconductors, or GaAs-based semiconductors.

The process (S220) of forming the convex-concave pattern on the material layer for formation of the convex-concave pattern through photolithography may be performed in the same manner as the aforementioned photolithography. By the process (S230) of transferring the material layer for formation of the convex-concave pattern, which is disposed on the support substrate and is formed with the convex-concave pattern through the processes S210 and S220, to the upper surface of the light emitting structure, the convex-concave pattern may be formed on the light emitting structure.

In one embodiment, the process of transferring the convex-concave pattern onto the light emitting structure may be performed using a thermal release tape, without being limited thereto. Specifically, with the thermal release tape attached to the convex-concave pattern formed on the support substrate, the convex-concave pattern is removed from the support substrate and attached to the upper surface of the light emitting structure, and is then subjected to thermal compression. The convex-concave pattern is transferred to the upper surface of the light emitting structure by thermal compression, followed by removing the thermal release tape from the convex-concave pattern, thereby completing the process of transferring the convex-concave pattern.

Referring to FIG. 1, in step 3) of the method of fabricating a light emitting diode according to the embodiment of the invention, a nanosphere layer may be transferred to an upper surface of the convex-concave pattern (S300).

The nanosphere layer is formed to provide a uniform nanostructure having high density on the surface of the convex-concave pattern in order to form the stepped surface structure capable of improving light extraction efficiency, and may have a size of several nanometers (nm) or hundreds of nanometers.

Specifically, the step of transferring the nanosphere layer to the upper surface of the convex-concave pattern may include forming the nanosphere layer on a support substrate through nanosphere lithography (S310), attaching the nanosphere layer to the upper surface of the convex-concave pattern using a thermal release tape, followed by thermal compression (S320), and removing the thermal release tape from the nanosphere layer (S330).

The nanosphere lithography may be performed through nanosphere lithography known in the art. Specifically, the process of forming the nanosphere layer on the support substrate through nanosphere lithography (S310) may include depositing a solution, in which a plurality of nanosphere particles capable of self-assembling is dispersed, onto the support substrate (S311), and crystallizing the nanosphere particles into a colloid to form a nanosphere layer having a two-dimensional colloidal crystal structure on the support substrate (S312).

The nanosphere particles may be materials capable of self-assembling. Specifically, the nanosphere particles may include at least one material selected from silicon (Si), gold (Au), silver (Ag), platinum (Pt), iron (Fe), copper (Cu), aluminum (Al), nickel (Ni), and oxides, nitrides and sulfides thereof. Herein, the term "self-assembling" means exhibition of characteristics of a new material by spontaneously forming a nanostructure of a certain shape through covalent bonding between atoms or mutual attraction between molecules. The nanosphere particles may be dispersed in a solvent contained in the solution, and the solvent may be a material which allows easy removal by a subsequent process without affecting properties of the nanosphere particles. For example, the solvent may be an organic solvent such as ethanol, methanol, and butanol.

Specifically, in S311, the solution in which the plurality of nanosphere particles capable of self-assembling is dispersed is deposited on the support substrate. This process may be performed by dip coating, drop coating or spin coating, without being limited thereto.

Thereafter, in S312, the plurality of nanosphere particles capable of self-assembling deposited on the support substrate is crystallized into a colloid to form a nanosphere layer having a two-dimensional colloidal crystal structure on the support substrate. Specifically, this process may be performed by at least one method selected from among evaporation, electrostatic deposition, dip coating, Langmuir-Blodgett coating, electrophoretic deposition, or spin coating. As a result, the plurality of nanosphere particles capable of self-assembling is crystallized into a colloid on the support substrate, so that the nanosphere layer can have the two-dimensional colloidal crystal structure on the support substrate.

Thereafter, in S320, the nanosphere layer is attached to the convex-concave pattern via the thermal release tape, followed by thermal compression. Specifically, the process of attaching the nanosphere layer to the convex-concave pattern via the thermal release tape, followed by thermal compression, may be performed at a temperature of 100° C. to 200° C. under a load of 0.1 MPa to 1 MPa. If thermal compression is performed at a temperature of less than 100° C. or under a load of less than 0.1 MPa, it can be difficult to transfer the nanosphere layer from the thermal release tape to the convex-concave pattern. If thermal compression is performed at a temperature of greater than 200° C., the thermal release tape can be dissolved, affecting the nanosphere layer. Thus, thermal compression may be performed at a temperature within the above temperature range. In addition, if thermal compression is performed under a load of greater than 1 MPa, the nanosphere layer can be deeply placed inside the convex-concave pattern instead of being placed on the surface thereof, thereby making it difficult to perform etching. Thus, thermal compression may be performed under a load within the above range.

Thereafter, in S330, the thermal release tape is removed from the nanosphere layer. The thermal release tape is a tape which loses adhesion upon application of heat and thus can be easily separated from the nanosphere layer due to heat during thermal compression. The thermal release tape is not particularly limited and may be obtained from any commercially available products.

As described above, the nanosphere lithography by which the nanosphere layer having a two-dimensional colloidal crystal structure is formed using the nanosphere particles capable of self-assembling does not require typical processes for general lithography, such as photoresist coating, exposure and development, thereby simplifying the fabrication process. In addition, since the nanosphere layer transferred to the surface of the convex-concave pattern through the nanosphere lithography has a fine nanoscale structure, the nanosphere layer per se can become a surface for improving light extraction efficiency and can be used to form a plurality of nanobumps on the convex-concave pattern through dry etching described below, thereby facilitating formation of the stepped surface structure according to the present invention.

Referring to FIG. 1, in step 4) of the method of fabricating a light emitting diode according to the embodiment of the invention, a stepped surface structure having a plurality of nanobumps may be formed on the upper surface of the convex-concave pattern by dry etching the nanosphere layer (S400).

Specifically, upon dry etching the nanosphere layer, the stepped surface structure having the plurality of nanobumps arranged thereon may be formed on the surface of the convex-concave pattern. The nanobumps refer to protrusions having a size of several nanometers to hundreds of nanometers. The nanobumps formed by etching the nanosphere layer may be disposed in a stepped structure on the surface of the convex-concave pattern according to the structure and shape of the nanosphere layer transferred in a stepped structure along the surface of the convex-concave pattern. This structure will be described in more detail with reference to the following embodiments and the accompanying drawings.

Dry etching may be performed by inductively coupled plasma (ICP)/reactive ion etching (RIE), or reactive ion etching using at least one etching gas selected from among $Cl_2$, Ar, $CH_4$, $H_2$, HBr and $BCl_3$.

Thereafter, the light emitting diode having the stepped surface structure may be subjected to chemical coating to reduce surface energy of the stepped surface structure. Although the stepped surface structure, which is not subjected to coating to reduce surface energy thereof, can provide a self-cleaning function due to superhydrophobic properties thereof, contaminants can include oil having low surface tension in practical use of the light emitting diode. When a surface exhibiting superhydrophobic properties through a physical structure without chemical treatment is exposed to contaminants such as oil, the surface loses the superhydrophobic properties and thus fails to provide the self-cleaning function. Accordingly, when chemical surface treatment for reducing surface energy is performed to form a surface structure imparting superhydrophobic and superoleophobic properties, the light emitting diode can also provide an antifouling function, which is not provided by a typical light emitting diode, thereby improving industrial competitiveness based on this functional differentiation.

Chemical coating of the light emitting diode including the stepped surface structure to reduce surface energy of the stepped surface structure may be performed using at least one material selected from among fluorinated acrylic copolymer, 1H,1H,2H,2H-heptadecafluorodecyl modified polyhedral oligomeric silsesquioxane (fluoroPOSS), PTFE amorphous fluoropolymer, fluorinated monoalkylphosphates, n-perfluoroeicosane, tridecafluoro-1,1,2,2-tetrahydrooctyltrichlorosilane, fluorinated 3,4-ethylenedioxypyrrole (EDOP) monomer, and semifluorinated silane ((tridecafluoro-1,1,2,2-tetrahydrooctyl)-1-trichlorosilane) by sputtering, vacuum evaporation, dip coating, spray coating, or molecular vapor deposition.

In one embodiment, the method may further include, before forming the convex-concave pattern on the light emitting structure, forming a reflective electrode layer on the light emitting structure, partially etching the light emitting structure and the reflective electrode layer to expose a partial region of the first conductive type semiconductor layer, forming a passivation layer on an upper surface of the reflective electrode layer and exposed side surfaces of the light emitting structure and the reflective electrode layer, forming a first electrode on the exposed partial region of the first conductive type semiconductor layer, bonding a carrier substrate to an upper surface of the passivation layer via a bonding member, separating the light emitting structure from the substrate, and forming a second electrode on a partial region of the reflective electrode layer.

Specifically, before the convex-concave pattern is formed on the light emitting structure, the reflective electrode layer may be formed on the second conductive type semiconductor layer. The reflective electrode layer serves not only to reflect light, but also as an electrode electrically connected to the light emitting structure. The reflective electrode layer may be formed of a metallic material having high reflectivity, for example, at least one selected from among Ni, Pt, Pd, Rh, W, Ti, Al, Ag and Au. The reflective electrode layer may be formed by sputtering or vacuum evaporation, without being limited thereto.

Thereafter, the light emitting structure and the reflective electrode layer are partially removed by etching so as to expose some region of the first conductive type semiconductor layer. This process may be performed by a typical etching process for formation of electrodes of a vertical light emitting diode known in the art, and is not particularly limited. By etching, a plurality of holes such as via-holes may be formed in the light emitting structure and the reflective electrode layer.

Thereafter, the passivation layer may be formed on the upper surface of the reflective electrode layer and the exposed side surfaces of the light emitting structure and reflective electrode layer exposed by etching. The passivation layer serves to electrically insulate the light emitting structure from the reflective electrode layer in order to prevent current leakage from a sidewall of the light emitting structure and from an upper surface and a sidewall of the reflective electrode layer, and may be formed on a side surface of the light emitting structure and on the upper surface and the side surface of the reflective electrode layer before bonding the light emitting structure to a carrier substrate. The passivation layer may be formed of an insulation material known in the art, for example, $SiO_2$, SiNx, $TiO_2$ or $Al_2O_3$, without being limited thereto.

As described above, after formation of the passivation layer, the first electrode may be formed on the exposed region of the first conductive type semiconductor layer. Specifically, the light emitting structure and the reflective electrode layer are subjected to etching such that a surface of the first conductive type semiconductor layer is partially exposed, whereby the first electrode can be formed on the first conductive type semiconductor layer on which the via-holes are disposed. In some embodiments, the first electrode may be provided in plural on some exposed regions of the first conductive type semiconductor layer corresponding to the number of via-holes formed by etching.

Each of the first electrode and the second electrode described below may be formed of at least one metal selected from among palladium (Pd), rhodium (Rh), platinum (Pt), tantalum (Ta), nickel (Ni), chromium (Cr), gold (Au) and titanium (Ti), or alloys thereof, and may be formed by a typical electrode formation method for light emitting diodes known in the art.

Thereafter, the carrier substrate may be bonded to an upper surface of the passivation layer via a bonding member. Specifically, the carrier substrate is coupled to the upper surface of the passivation layer via the bonding member. The carrier substrate may be selected from any substrate applicable to a final light emitting diode, and may be a typical substrate for light emitting diodes known in the art. The carrier substrate may be, for example, a conductive substrate, an insulating substrate or a circuit board. The bonding member may be selected from any bonding material for light emitting diodes known in the art, and may include, for example, at least one material selected from the group consisting of Ga, Bi, In, Sn, Pb, Au, Al, Ag, Cu, Ni, Pd, Si and Ge, without being limited thereto. The bonding member may be formed on the passivation layer via physical deposition, electrochemical deposition or chemical deposition.

Bonding the carrier substrate to the upper surface of the passivation layer via the bonding member may be performed by thermo-compressive bonding, without being limited thereto. For example, thermo-compressive bonding may be performed at a temperature of 100° C. to 600° C. under a load of 1 MPa to 200 MPa.

Thereafter, the substrate may be separated from the light emitting structure. Separation of the substrate from the light emitting structure may be performed by a typical substrate separation process known in the art. For example, separation of the substrate from the light emitting structure may be performed by laser lift-off using a laser beam, chemical lift-off such as wet etching, or chemical mechanical polishing, without being limited thereto.

The light emitting structure is separated from the substrate and turned upside down, since the light emitting structure is bonded to the carrier substrate, the carrier substrate can become a support substrate of the light emitting structure.

Thereafter, the second electrode may be formed on a partial region of the reflective electrode layer. The second electrode may be formed of the aforementioned electrode material using a typical electrode formation method for light emitting diodes known in the art.

FIG. 2a to FIG. 2j are schematic sectional views illustrating the method of fabricating a light emitting diode according to the embodiment of the present invention. Specifically, since FIG. 2 shows enlarged sectional views of one convex portion of a convex-concave pattern having a plurality of nanobumps formed on a surface thereof, the overall light emitting diode may have an enlarged shape of the structure shown in FIG. 2.

Figure 2A:
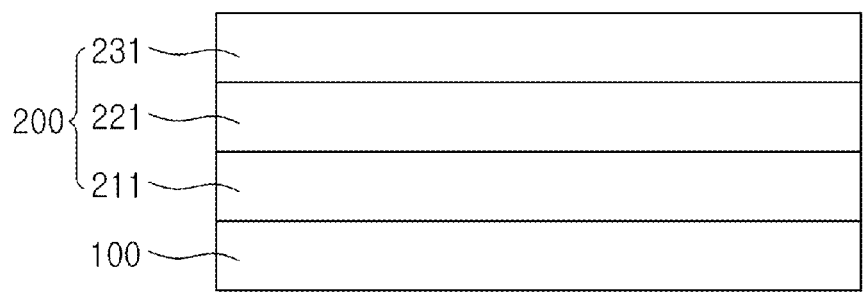
Figure 2B:
Figure 2C:
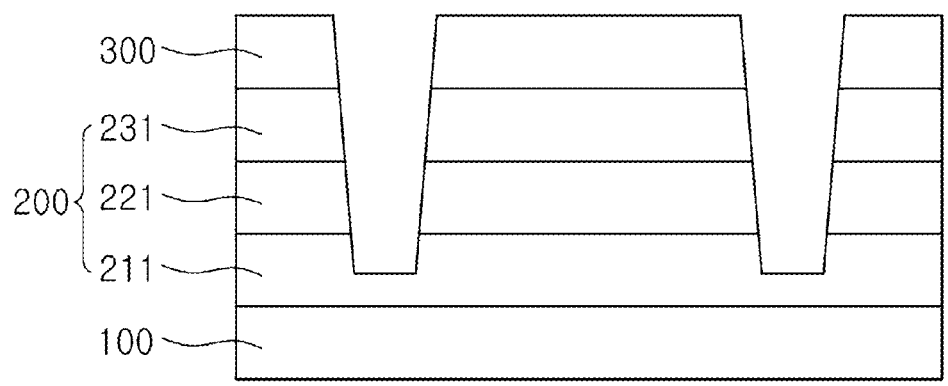
Figure 2D:
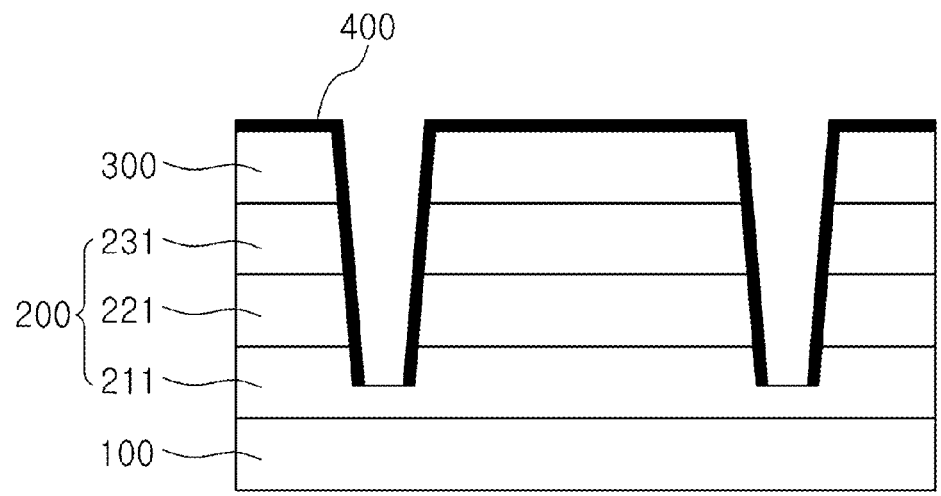
Figure 2E:
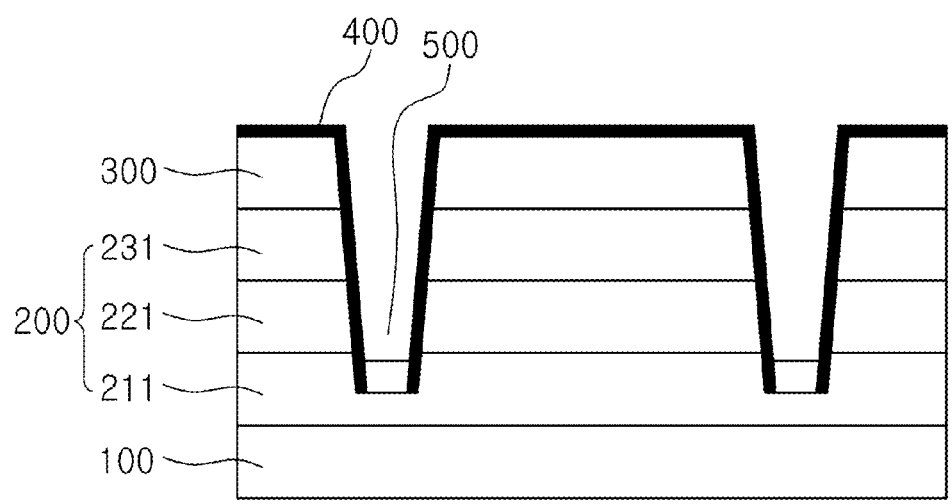
Figure 2F:
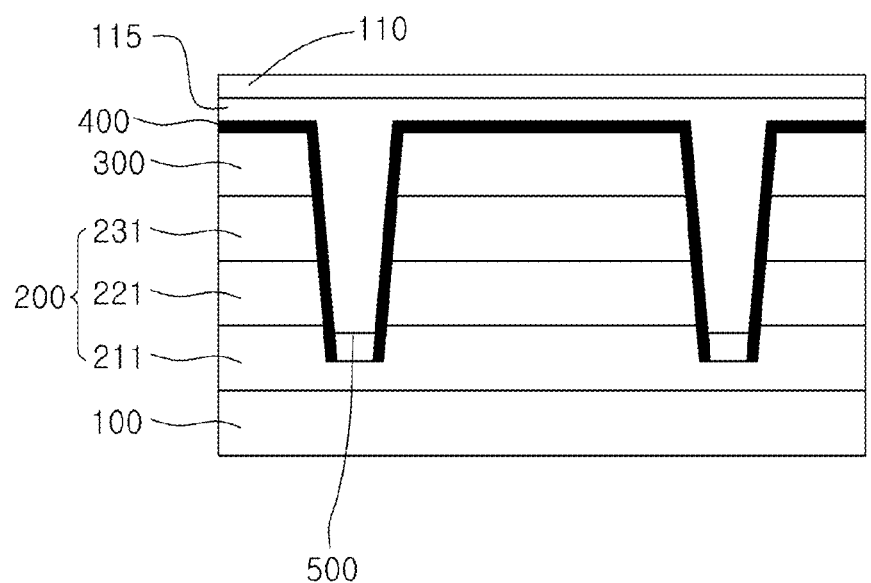
Figure 2G:
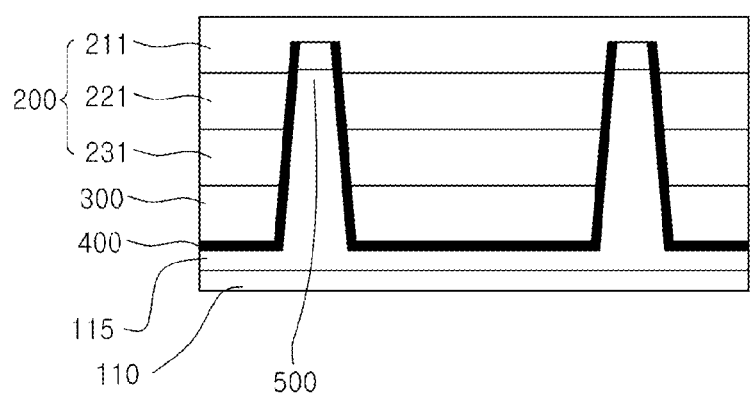

Referring to FIG. 2a, first, a light emitting structure 200 may be formed by sequentially stacking a first conductive type semiconductor layer 211, an active layer 221 and a second conductive type semiconductor layer 231 on a substrate 100. Referring to FIG. 2b, a reflective electrode layer 300 may be formed on the light emitting structure 200. Thereafter, as shown in FIG. 2c, the light emitting structure 200 and the reflective electrode layer 300 are partially etched to expose a partial region of the first conductive type semiconductor layer 211. Then, referring to FIG. 2d, a passivation layer 400 may be formed on an upper surface of the reflective electrode layer 300 and side surfaces of the light emitting structure 200 and the reflective electrode layer 300, which are exposed by etching. Then, a first electrode 500 may be formed on the partial region of the first conductive type semiconductor layer 211, which is exposed by etching. As shown in FIG. 2f, a carrier substrate 110 may be bonded to an upper surface of the passivation layer 400 via a bonding member 115. Thereafter, as shown in FIG. 2g, the substrate 100 is separated from the light emitting structure 200, which in turn is turned upside down. After turning the light emitting structure 200 upside down, a second electrode (not shown) may be formed on a partial region of the reflective electrode layer 300.

Figure 2H:
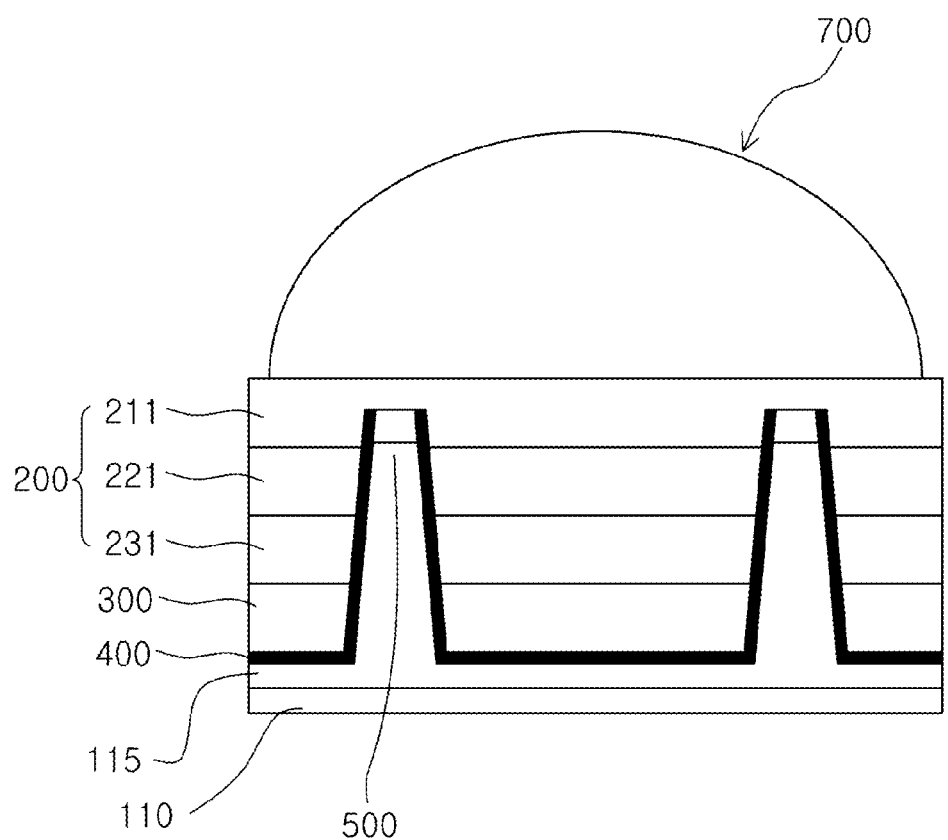

Thereafter, a convex-concave pattern 700 may be formed on an exposed surface of the first conductive type semiconductor layer 211, as shown in FIG. 2h. The convex-concave pattern 700 may be directly formed on the first conductive type semiconductor layer 211 through photolithography. Alternatively, the convex-concave pattern 700 may be formed on a separate support substrate and transferred to the first conductive type semiconductor layer 211. The convex-concave pattern 700 formed on the light emitting structure 200 may have a micrometer-scale dome structure.

Figure 2I:
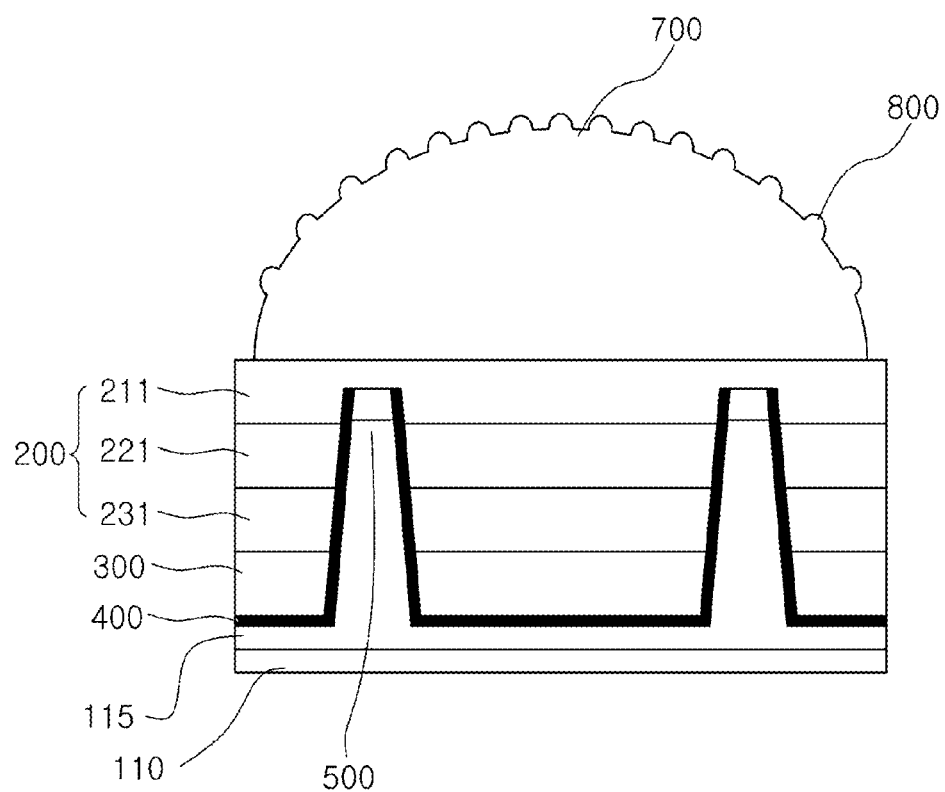

Thereafter, as shown in FIG. 2i, a nanosphere layer 800 may be transferred to an upper surface of the convex-concave pattern 700. Thereafter, as shown in FIG. 2j, the nanosphere layer 800 transferred to the upper surface of the convex-concave pattern 700 may be subjected to dry etching to form a plurality of nanobumps 850 on the convex-concave pattern 700, thereby providing a light emitting diode including a stepped surface structure.

Now, a process of transferring the nanosphere layer 800 to the convex-concave pattern 700 will be described in more detail with reference to FIG. 3.

Figure 3:
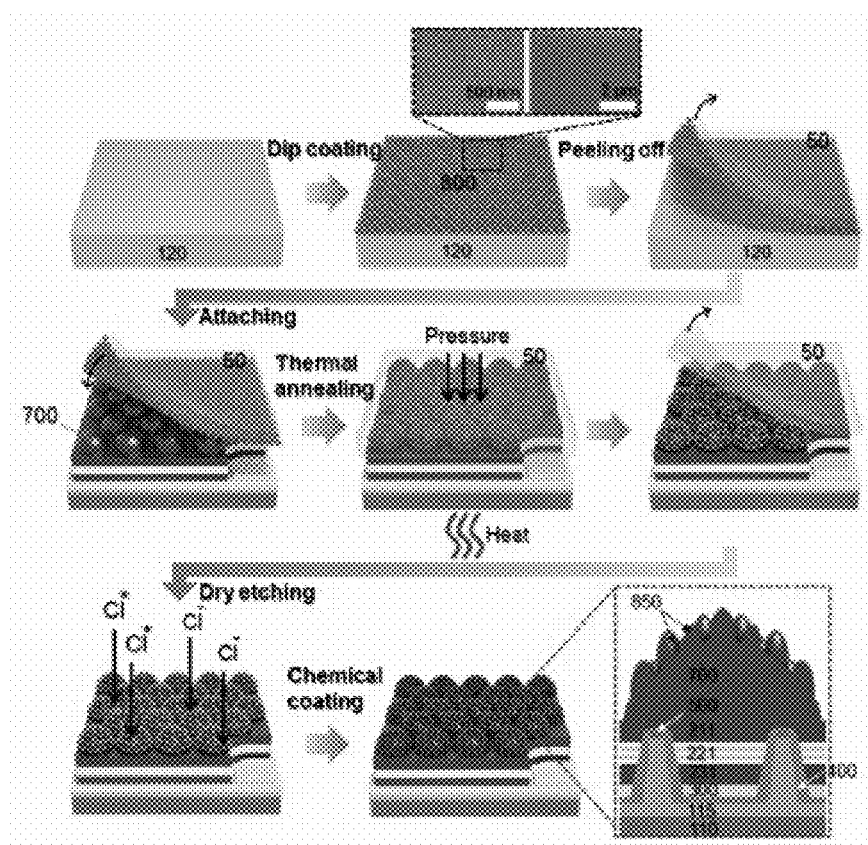
FIG. 3 is a flow diagram of a process of transferring a nanosphere layer to an upper surface of a convex-concave pattern, followed by etching, in the method according to the embodiment of the present invention.

FIG. 3 is a flow diagram of a process of transferring a nanosphere layer to an upper surface of a convex-concave pattern, followed by etching, in the method according to the embodiment of the present invention.

Referring to FIG. 3, first, a solution, in which a plurality of nanosphere particles capable of self-assembling is dispersed, may be deposited on a separate support substrate 120 by dip coating, followed by crystallizing the plurality of nanosphere particles capable of self-assembling to form a nanosphere layer 800 having a two-dimensional colloidal crystal structure. Thereafter, a thermal release tape 50 may be attached to the nanosphere layer 800 formed on the support substrate 120 to peel the nanosphere layer 800 off the support substrate 120.

The nanosphere layer 800 attached to the thermal release tape 50 may be attached to the convex-concave pattern 700, which is formed through processes shown in FIG. 2a to FIG. 2h. Then, the nanosphere layer 800 is subjected to thermal annealing under pressure, whereby the nanosphere layer 800 can be transferred to the upper surface of the convex-concave pattern 700. Thereafter, the thermal release tape 50 may be removed from the nanosphere layer 800.

When the nanosphere layer 800 is subjected to dry etching using at least one etching gas selected from among $Cl_2$, Ar, $CH_4$, $H_2$, HBr and $BCl_3$, a plurality of nanobumps 850 may be formed on the convex-concave pattern 700. Thereafter, the light emitting diode having the stepped surface structure may be subjected to chemical coating to reduce surface energy. In an enlarged sectional view of one convex portion, it can be seen that the light emitting diode having the stepped surface structure as shown in FIG. 2j is fabricated.

In another embodiment of the invention, the method may further include forming a first electrode and a second electrode on some regions of the first conductive type semiconductor layer and the second conductive type semiconductor layer, respectively.

Each of the first electrode and the second electrode may be formed of at least one metal selected from among palladium (Pd), rhodium (Rh), platinum (Pt), tantalum (Ta), nickel (Ni), chromium (Cr), gold (Au) and titanium (Ti), or alloys of these metals, and may be formed by a typical electrode formation method for light emitting diodes known in the art. This process will be described in more detail with reference to FIG. 4.

FIG. 4a to FIG. 4e are schematic sectional views illustrating a method of fabricating a light emitting diode according to another embodiment of the present invention.

Figure 4A:
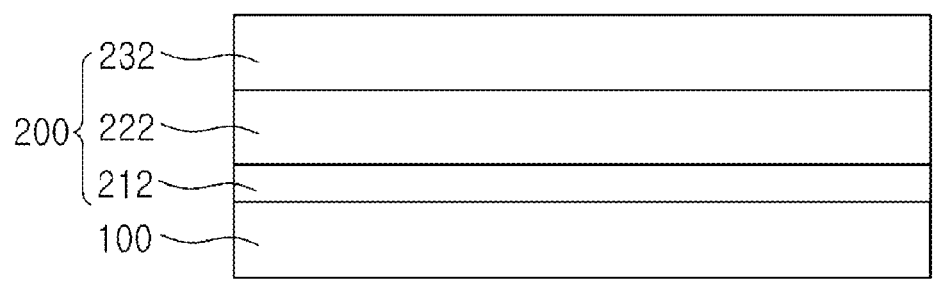
FIG. 4a to FIG. 4e are schematic sectional views illustrating a method of fabricating a light emitting diode according to another embodiment of the present invention.
Figure 4B:
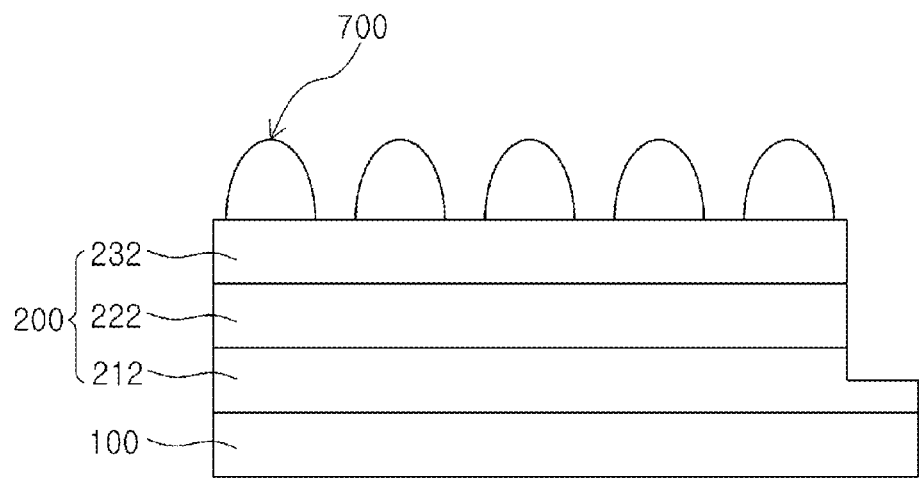
Figure 4C:
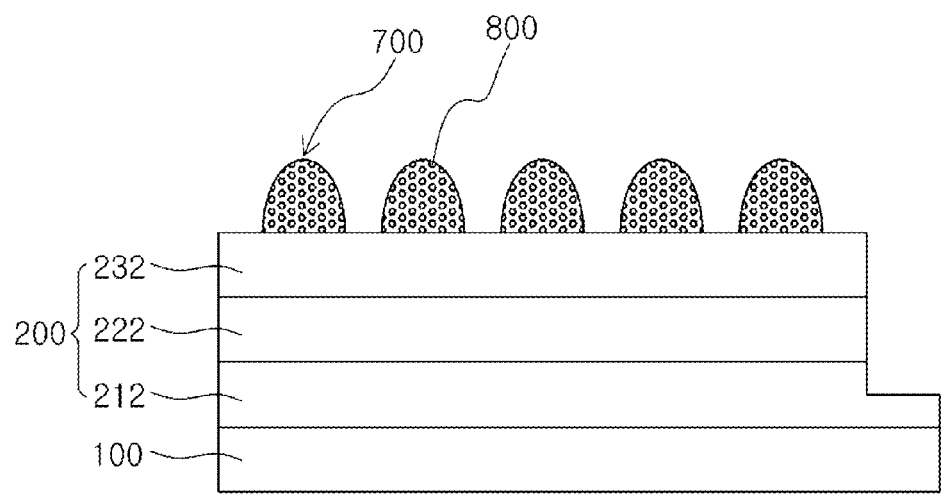
Figure 4D:
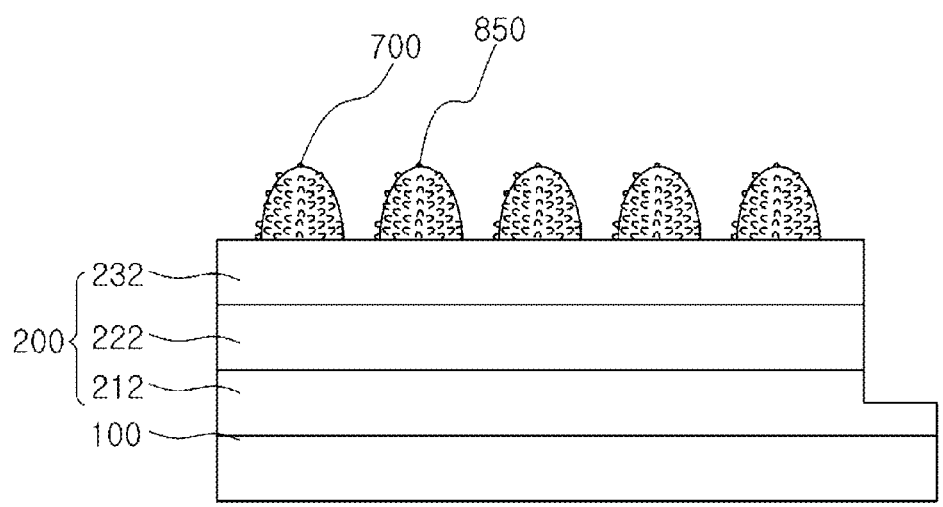
Figure 4E:
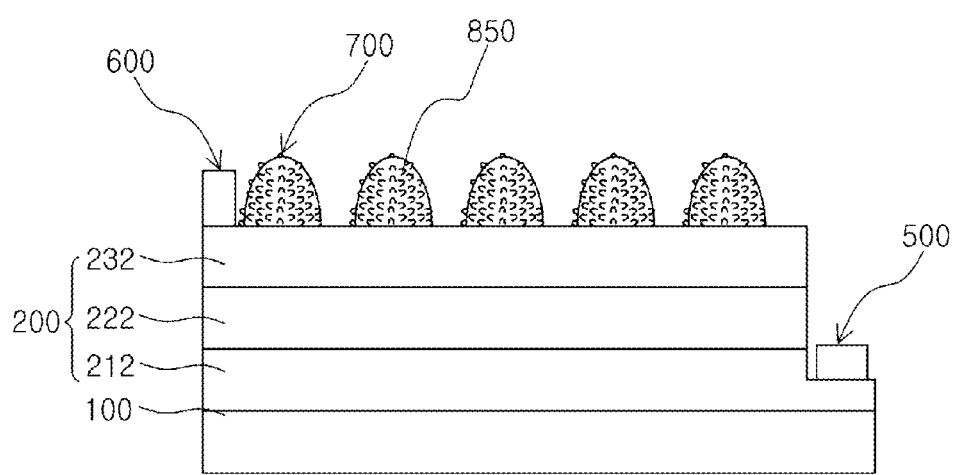

Referring to FIG. 4a, first, a light emitting structure 200 may be formed by sequentially stacking a first conductive type semiconductor layer 212, an active layer 222 and a second conductive type semiconductor layer 232 on a substrate 100. Referring to FIG. 4b, a convex-concave pattern 700 may be formed on the light emitting structure 200. The convex-concave pattern 700 may be directly formed on the first conductive type semiconductor layer 212 through photolithography. Alternatively, the convex-concave pattern 700 may be formed on a separate support substrate and transferred to the first conductive type semiconductor layer 212. Thereafter, as shown in FIG. 4c, a nanosphere layer 800 may be transferred to an upper surface of the convex-concave pattern 700. Thereafter, as shown in FIG. 4d, the nanosphere layer 800 transferred to the upper surface of the convex-concave pattern 700 may be subjected to dry etching to form a plurality of nanobumps 850 on the convex-concave pattern 700. Thereafter, a first electrode 500 and a second electrode 600 are formed on some regions of the first conductive type semiconductor layer 212 and the second conductive type semiconductor layer 232, respectively, thereby providing a light emitting diode including a stepped surface structure. Thereafter, the light emitting diode having the stepped surface structure may be subjected to chemical coating to reduce surface energy.

As such, the method of fabricating a light emitting diode according to the present invention can be easily applied to a vertical light emitting diode and a lateral light emitting diode according to embodiments of the invention. In addition, the method of fabricating a light emitting diode is expected to be applicable to a flip-chip type light emitting diode, an inorganic light emitting diode, and an organic light emitting diode.

Another aspect of the present invention provides a light emitting diode fabricated by the method of fabricating a light emitting diode according to the present invention. The light emitting diode may include a light emitting structure in which a first conductive type semiconductor layer, an active layer and a second conductive type semiconductor layer are sequentially stacked on a substrate; a convex-concave pattern formed on the light emitting structure, and a stepped surface structure having a plurality of nanobumps formed on a surface of the convex-concave pattern by dry etching a nanosphere layer transferred to an upper surface of the convex-concave pattern.

The light emitting diode can permit shape control of the plurality of nanobumps formed on the surface of the convex-concave pattern through control of process conditions for dry etching so as to form a surface structure having high density and high aspect ratio, and can easily realize nanobumps having a theoretical side angle at which maximum light output can be obtained, thereby improving light uniformity and light extraction efficiency. Specifically, this will be described in more detail with reference to examples and the accompanying drawings.

The light emitting diode according to the present invention has surface energy minimized through the stepped surface structure and chemical coating and exhibits superhydrophobic and superoleophobic wetting properties to provide a self-cleaning function with respect to contaminants on the surface thereof, thereby preventing deterioration in luminous efficacy due to contaminants in practical use while improving lifespan. Specifically, these effects will become apparent from the following examples.

EXAMPLE

Example 1: Fabrication of Light Emitting Diode Including Stepped Surface Structure A buffer layer, an n-GaN layer, MQW, a p-GaN layer and a reflective electrode layer were formed on a sapphire substrate, followed by etching to form a passivation layer of $SiO_2$. An n-type electrode was formed on the etched region and an Al-deposited silicon substrate (Al/Si) was bonded to the passivation layer via a bonding member. The sapphire substrate was removed from a light emitting structure by wet etching the buffer layer, and a p-type electrode was formed on some region of the reflective electrode layer, thereby fabricating a light emitting diode.

The n-GaN layer disposed at an upper portion of the light emitting diode was subjected to photolithography to form a convex-concave pattern in which a plurality of convex portions having a semispherical shape is periodically uniformly arranged.

Silica dispersed in ethanol was deposited onto a separate sapphire substrate and crystallized into a colloid to form a nanosphere layer. Then, the nanosphere layer was removed from the sapphire substrate using a thermal release tape and was attached to the fabricated light emitting diode, followed by heat treatment at a temperature of about 150° C. under a load of about 0.5 MPa. Then, the thermal release tape was removed from the nanosphere layer, thereby forming the convex-concave pattern onto which the nanosphere layer was transferred.

Thereafter, the nanosphere layer was subjected to dry etching at a pressure of $1.0 \times 10^{-2}$ Torr in a reactor, to which Cl$_2$, Ar, CH$_4$ and H$_2$ was supplied, using an inductively coupled plasma (ICP) system at 1500 W while applying a power of 150 W using an RF apparatus, thereby forming a plurality of nanobumps on the convex-concave pattern.

Comparative Example 1: Fabrication of Light Emitting Diode not Including Stepped Surface Structure A light emitting diode having a flat surface structure was fabricated by the same processes as in Example 1 except for the process of forming the convex-concave pattern and the nanosphere layer, followed by dry etching the nanosphere layer.

Comparative Example 2: Fabrication of Light Emitting Diode Including Convex-Concave Pattern Alone A light emitting diode having a convex-concave pattern on a light emitting structure was fabricated by the same processes as in Example 1 except for the process of forming the nanosphere layer, followed by dry etching the nanosphere layer.

Figure 5:
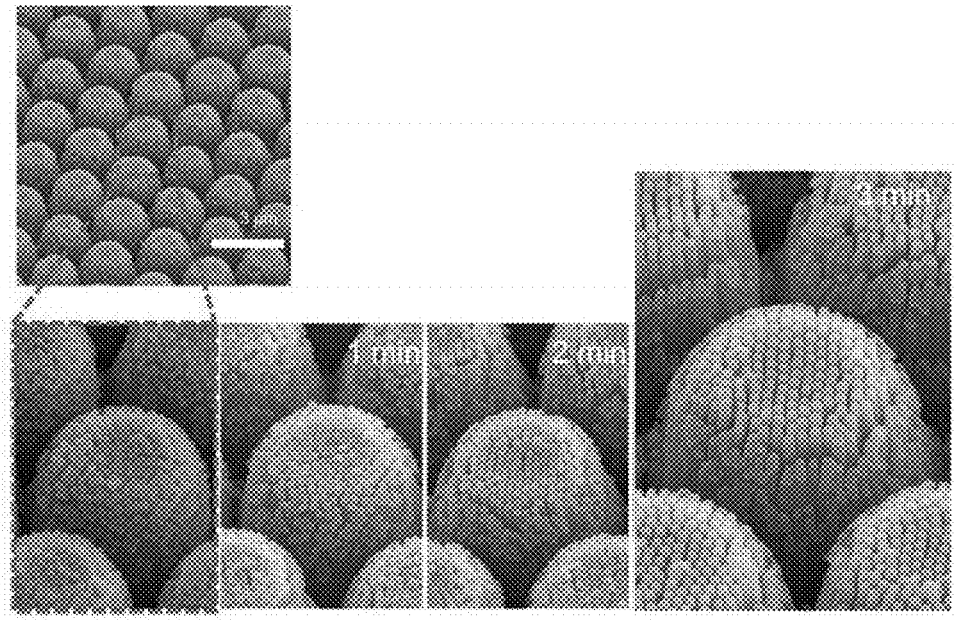
FIG. 5 is a scanning electronic micrograph (SEM) of a stepped surface structure formed by dry etching in Example 1.

FIG. 5 is a scanning electronic micrograph (SEM) of a stepped surface structure formed by dry etching in Example 1.

Referring to FIG. 5, it can be seen that a plurality of nanobumps was periodically disposed in a stepped arrangement on a semispherical convex-concave pattern formed on a light emitting diode. In addition, it can be seen that, as dry etching was performed from 1 minute to 3 minutes, the plurality of nanobumps was etched while maintaining the stepped arrangement, thereby forming a surface structure having high density/high aspect ratio. As such, according to the present invention, the convex-concave pattern may be formed on the light emitting structure to improve light extraction efficiency, and the shape of the plurality of nanobumps formed on the surface of the convex-concave pattern can be easily controlled by controlling process conditions upon dry etching the nanosphere layer formed through nanosphere lithography and transferred to the convex-concave pattern.

Specifically, the process conditions depend on a mixing ratio of process gases, process plasma power, process time, and process pressure. Upon formation of a nanostructure on a microstructure in a conventional technique using an alkali solution, when the density and size of the nanostructures are changed by changing process variables, it is difficult to provide high density/high aspect ratio maximizing characteristics of the light emitting diode since these two values are inversely proportional. On the contrary, the present invention can overcome such a problem through nanosphere lithography and dry etching, as described above.

Furthermore, as shown in FIG. 5, the method according to the present invention can control the side surface angle of the plurality of nanobumps by controlling the process conditions upon dry etching, thereby easily realizing a theoretical side surface angle capable of maximizing light output.

Figure 6:
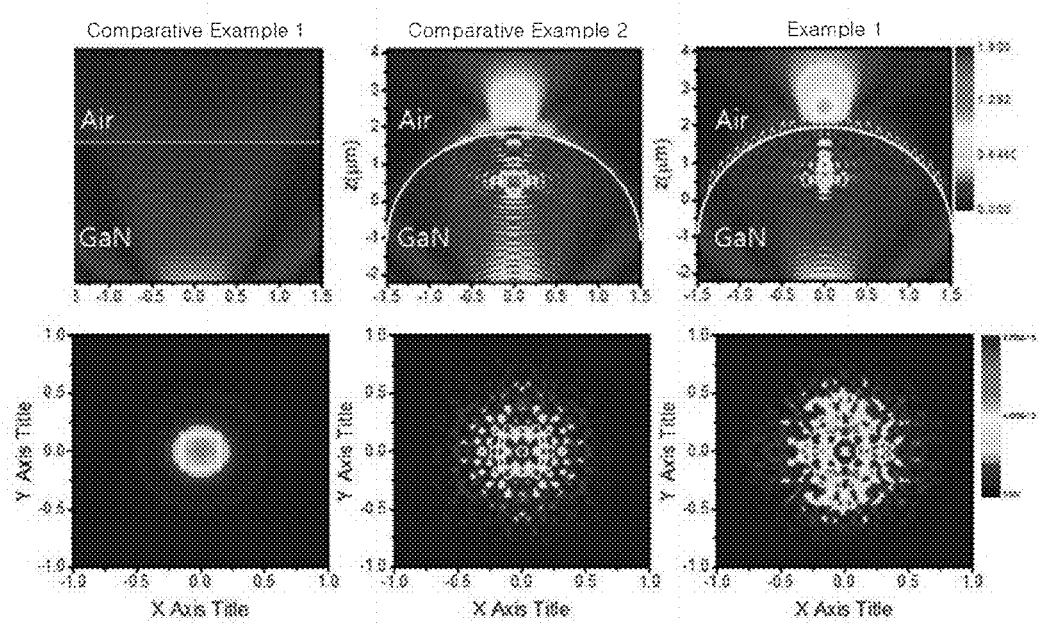
FIG. 6 shows simulation results of a finite-difference time domain method with respect to light emitting diodes fabricated in Example 1 and Comparative Examples 1 and 2.

FIG. 6 shows simulation results of a finite-difference time domain method with respect to light emitting diodes of Example 1 and Comparative Examples 1 and 2.

Referring to FIG. 6, it can be seen that the typical vertical type light emitting diode having a flat surface structure as fabricated in Comparative Example 1 had substantially no light extraction and the light emitting diode including the micrometer-scale convex-concave pattern alone as fabricated in Comparative Example 2 had higher light extraction than the light emitting diode of Comparative Example 1. It can be seen that the light emitting diode including the stepped surface structure as fabricated in Example 1 had much higher light extraction than the light emitting diodes of Comparative Examples 1 and 2. That is, the stepped surface structure of the light emitting diode fabricated in Example 1 relieved internal total reflection between air and the light emitting structure composed of GaN-based compound semiconductors, thereby promoting light extraction, as compared with the light emitting diodes of Comparative Examples 1 and 2.

Figure 7:
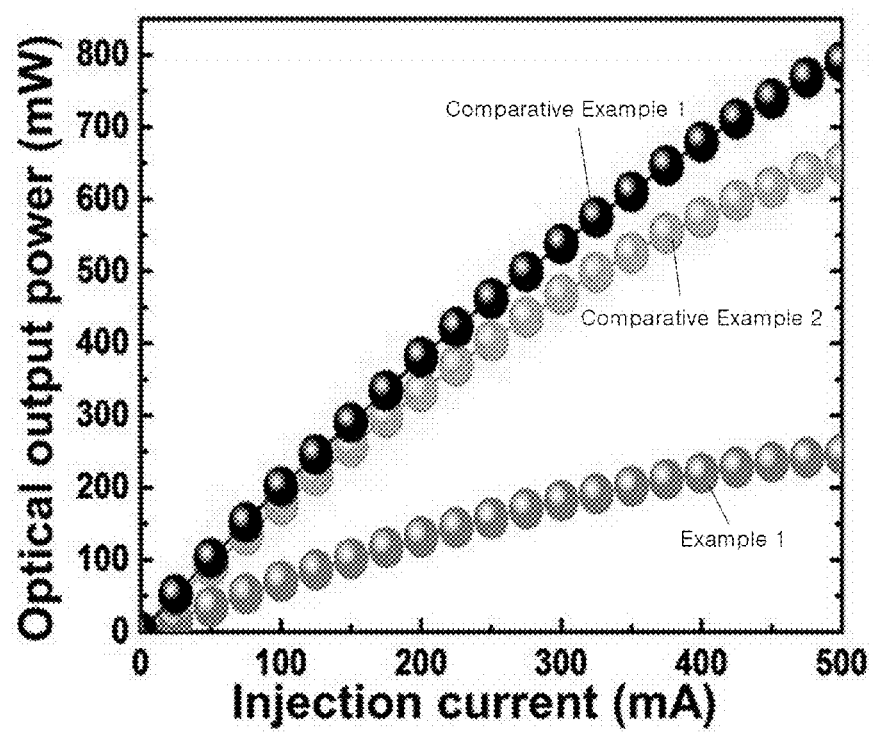
FIG. 7 is a graph depicting light output of the light emitting diodes fabricated in Example 1 and Comparative Examples 1 and 2.

FIG. 7 is a graph depicting light output of the light emitting diodes fabricated in Example 1 and Comparative Examples 1 and 2.

Referring to FIG. 7, it can be seen that the light emitting diode including the stepped surface structure of Example 1 and the light emitting diode including the micrometer scale convex-concave pattern alone of Comparative Example 2 could provide light output 3.16 times and 2.70 times the light output of the typical vertical type light emitting diode having the flat surface structure of Comparative Example 1, respectively. As such, the light emitting diode according to the present invention includes the convex-concave pattern and the plurality of nanobumps formed on the surface of the convex-concave pattern, and provides superior light output to the light emitting diode having a typical flat surface structure or the light emitting diode including the convex-concave pattern alone. Thus, it is anticipated that the light emitting diode according to the present invention will be actively used in the related fields.

Figure 8:
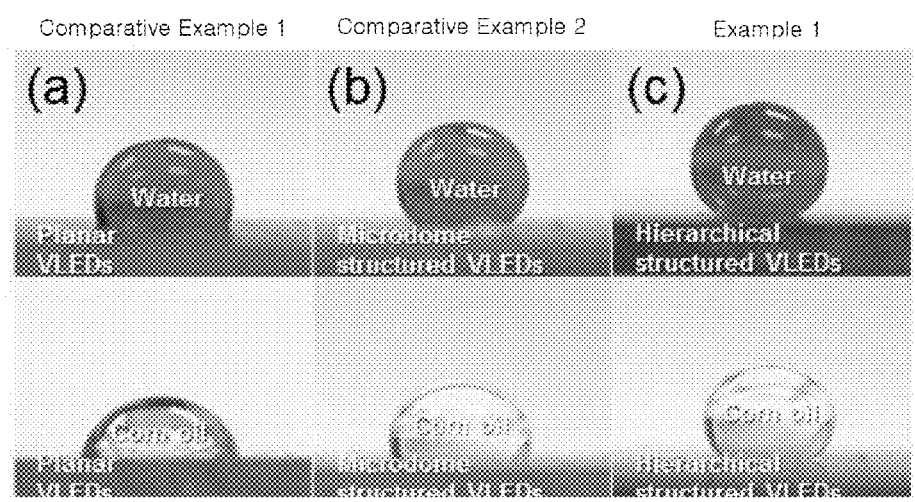
FIG. 8 is pictures of water droplets and soybean oil droplets on surface structures of the light emitting diodes fabricated in Example 1 and Comparative Examples 1 and 2.

FIG. 8 is pictures showing wetting properties on surface structures of the light emitting diodes fabricated in Example 1 and Comparative Examples 1 and 2.

Referring to FIG. 8, it can be seen that the light emitting diode including the stepped surface structure of Example 1 exhibited superhydrophobic and superoleophobic ($\theta$>150°) characteristics and provided an antifouling function.

Although some embodiments have been described herein, it should be understood that these embodiments are given by way of illustration only and that various modifications, variations, and alterations can be made by those skilled in the art without departing from the spirit and scope of the invention. Therefore, the scope of the invention should be limited only by the accompanying claims and equivalents thereof.

LIST OF REFERENCE NUMERAL

| | |
|---|---|
| 50: thermal release tape | 100: substrate |
| 110: carrier substrate | 115: bonding member |
| 200: light emitting structure | 211, 212: first conductive type semiconductor layer |
| 221, 222: active layer | 231, 232: second conductive type semiconductor layer |
| 300: reflective electrode layer | 400: passivation layer |
| 500: first electrode | 600: second electrode |
| 700: convex-concave pattern | 800: nanosphere layer |
| 850: nanobumps | |

What is claimed is:

1. A method of fabricating a light emitting diode, comprising:

forming a light emitting structure by sequentially stacking a first conductive type semiconductor layer, an active layer and a second conductive type semiconductor layer on a substrate;

forming a convex pattern on the light emitting structure;

transferring a nanosphere layer to an upper surface of the convex pattern; and forming a stepped surface structure having a plurality of nanobumps arranged on the upper surface of the convex pattern by dry etching the nanosphere layer, wherein transferring the nanosphere layer to the upper surface of the convex pattern comprises:

forming the nanosphere layer on a support substrate through nanosphere lithography;

attaching the nanosphere layer to the upper surface of the convex pattern using a thermal release tape, followed by thermal compression; and removing the thermal release tape from the nanosphere layer.

2. The method of fabricating a light emitting diode according to claim 1, wherein the convex pattern comprises a plurality of convex portions having one shape selected from among a semispherical shape, a conical shape or a poly-pyramidal shape.

3. The method of fabricating a light emitting diode according to claim 1, wherein the step of forming the convex pattern on the light emitting structure is performed through photolithography.

4. The method of fabricating a light emitting diode according to claim 1, wherein the step of forming the convex pattern on the light emitting structure comprises:

forming a material layer on a second support substrate;

forming the convex pattern on the material layer through photolithography; and transferring the material layer having the convex pattern formed thereon to an upper surface of the light emitting structure.

5. The method of fabricating a light emitting diode according to claim 1, wherein the step of forming the nanosphere layer on the support substrate through nanosphere lithography comprises:

depositing a solution, in which a plurality of nanosphere particles capable of self-assembling is dispersed, onto the support substrate; and crystallizing the nanosphere particles into a colloid to form a nanosphere layer having a two-dimensional colloidal crystal structure on the support substrate.

6. The method of fabricating a light emitting diode according to claim 5, wherein the nanosphere particles comprise at least one material selected from among silicon (Si), titanium (Ti), gold (Au), silver (Ag), platinum (Pt), iron (Fe), copper (Cu), aluminum (Al), nickel (Ni), and oxides, nitrides and sulfides thereof.

7. The method of fabricating a light emitting diode according to claim 5, wherein the step of crystallizing the nanosphere particles into the colloid is performed by one method selected from among vacuum evaporation, electrostatic deposition, dip coating, Langmuir-Blodgett coating, electrophoretic deposition, and spin coating.

8. The method of fabricating a light emitting diode according to claim 1, wherein the step of attaching the nanosphere layer to the convex pattern using the thermal release tape, followed by thermal compression, is performed at a temperature of 100° C. to 200° C. under a load of 0.1 MPa to 1 MPa.

9. The method of fabricating a light emitting diode according to claim 1, wherein dry etching of the nanosphere layer is performed by inductively coupled plasma/reactive ion etching, or reactive ion etching using at least one etching gas selected from among $Cl_2$, Ar, $CH_4$, $H_2$, HBr and $BCl_3$.

10. The method of fabricating a light emitting diode according to claim 1, further comprising: chemical coating the stepped surface structure to reduce surface energy thereof.

11. The method of fabricating a light emitting diode according to claim 10, wherein the step of chemical coating the stepped surface structure to reduce surface energy thereof comprises depositing at least one material selected from among fluorinated acrylic copolymer, 1H,1H,2H,2H-heptadecafluorodecyl modified polyhedral oligomeric silsesquioxane (fluoroPOSS), PTFE amorphous fluoropolymer, fluorinated monoalkylphosphates, n-perfluoroeicosane, tridecafluoro-1,1,2,2-tetrahydrooctyltrichlorosilane, fluorinated 3,4-ethylenedioxypyrrole (EDOP) monomer, and semifluorinated silane ((tridecafluoro-1,1,2,2-tetrahydroocty)-1-trichlorosilane) on the stepped surface structure.

12. The method of fabricating a light emitting diode according to claim 10, wherein the step of chemical coating the stepped surface structure to reduce surface energy thereof is performed by vacuum evaporation, spin coating, dip coating, spray coating, and molecular vapor deposition.

13. The method of fabricating a light emitting diode according to claim 1, further comprising: before forming the convex pattern on the light emitting structure, forming a reflective electrode layer on the light emitting structure;

partially etching the light emitting structure and the reflective electrode layer to expose a partial region of the first conductive type semiconductor layer;

forming a passivation layer on an upper surface of the reflective electrode layer and side surfaces of the light emitting structure and the reflective electrode layer exposed by etching;

forming a first electrode on the exposed partial region of the first conductive type semiconductor layer;

bonding a carrier substrate to an upper surface of the passivation layer via a bonding member;

separating the light emitting structure from the substrate; and forming a second electrode on a partial region of the reflective electrode layer.

14. The method of fabricating a light emitting diode according to claim 1, further comprising:

forming first and second electrodes on partial regions of the first conductive type semiconductor layer and the second conductive type semiconductor layer, respectively.

* * * * *